United States Patent [19]

Niehenke et al.

[11] Patent Number: 4,630,004
[45] Date of Patent: Dec. 16, 1986

[54] DIELECTRIC RESONATOR STABILIZED MICROSTRIP OSCILLATOR

[75] Inventors: Edward C. Niehenke, Baltimore; Patrick A. Green, Pasadena, both of Md.

[73] Assignee: The United States of America as represented by the Secretary of the Air Force, Washington, D.C.

[21] Appl. No.: 721,834

[22] Filed: Apr. 11, 1985

[51] Int. Cl.⁴ .................................................. H03B 5/00
[52] U.S. Cl. ............................ 331/107 SL; 331/117 D
[58] Field of Search ............... 331/96, 107 R, 107 SL, 331/117 D

[56] References Cited

U.S. PATENT DOCUMENTS

| | | | |
|---|---|---|---|
| 4,079,341 | 3/1978 | Linn et al. | 331/96 |
| 4,310,809 | 1/1982 | Buck et al. | 331/117 D |
| 4,375,621 | 3/1983 | Schneiter et al. | 332/16 T |
| 4,445,097 | 4/1984 | Godart et al. | 331/117 D |

OTHER PUBLICATIONS

Alley et al., 1979 IEEE MTT-S International Microwave Symposium Digest, Orlando, FL, 30 Apr.–2 May 1979, pp. 147–149.

Primary Examiner—Eugene R. LaRoche
Assistant Examiner—Robert J. Pascal
Attorney, Agent, or Firm—Donald J. Singer; Willard R. Matthews

[57] ABSTRACT

A microstrip L-band bipolar dielectric resonator stabilized oscillator (DRO) devised in a moderate size (2'×5"×3.6"), low-cost, reproducible circuit. Embedment of back to back varactors in the DRO provide voltage tuning for phase lock application without compromise of noise performance. Extremely low phase noise with a low 1/f noise corner is achieved and the DRO is essentially constant in frequency and output power over temperature, all due to unique circuit configuration. An internal buffer amplifier and dc regulatory circuits provide a DRO that is insensitive to frequency pulling due to load changes and power supply voltage leads. New standards of performance are accomplished that permit simplified stalo configuration with lower phase noise.

4 Claims, 5 Drawing Figures

DIELECTRIC RESONATOR STABILIZED MICROSTRIP OSCILLATOR

STATEMENT OF GOVERNMENT INTEREST

The invention described herein may be manufactured and used by or for the Government for governmental purposes without the payment of any royalty thereon.

BACKGROUND OF THE INVENTION

This invention relates to stable oscillators and in particular to a low noise L band dielectric resonator stabilized microstrip oscillator having ultra low phase noise, low 1/f noise corner and constant power and frequency over temperature.

Lower phase noise in oscillators with constant frequency and power over temperature is required in new emerging systems for improved dynamic range, simplicity, lower cost, and improved spectral purity. A fixed tuned stable oscillator with these desired features with low 1/f noise is a key element in modern stalo's. Such a source can be used in conjunction with a crystal multiplier source in an "active phase locked filter" to reduce crystal multiplier noise by as much as 20 dB. It can also be used as a primary source due to the accurate frequency characteristics.

In the past, oscillators usually consisted of a large coaxial cavity with coupling to the transistor, varactor, output, and frequency tuners. The theoretical Q of coaxial section is high, but with insertion of all the coupling elements, the actual Q is low (~500), and the circuit is generally very temperature sensitive requiring 2 varactors, one for temperature correction, and one for phase locking applications. This type of oscillator tends to be very expensive requiring critical assembly. An example of such a device is the E3A oscillator which in its day was state of the art but does not suffice for lower phase noise system requirements. The 1/f noise corner of this unit is, as well as most oscillators, approximately 100 KHz. Lower corners giving rise to lower phase noise at lower offset frequencies is highly desireable.

A dielectric resonator stabilized oscillator (DRO), on the other hand, has the capability of higher Q.

Such a device has been developed by Bell Laboratories and disclosed in detail in the publication of G. D. Alley and Han-Chiu Wang entitled *An Ultra-Low Noise Microwave Synthesizer*, IEEE Transactions Microwave Theory and Techniques, Vol. MTT-27, No. 12 December 1979, pp. 969-974. The device disclosed thereby has excellent noise characteristics but the transistors and resonator material are not available nor has this unit demonstrated stability both amplitude and frequency over large operating temperature ranges with large varactor modulation sensitivities.

A review of the current state of the art reveals that there are no known L-band DRO's that use commercially available transistors and resonator materials for low phase noise, low 1/f noise corner, constant frequency and power over wide operating temperature with a varactor tuning port.

It is apparent from the foregoing discussion that there currently exists the need for a stable oscillator having improved phase noise, phase corner and constant power and frequency over temperature characteristics. The present invention is directed toward providing an L-band DRO that will satisfy that need. In accomplishing that end it will be seen that the L-band DRO of the invention, hereinafter described in detail, is significantly different than any other reported DRO. Its noise is 20 dB better than the coaxial type units (E3A) with a 1/f noise corner one tenth of the E3A device, providing even lower noise at low offset frequencies.

SUMMARY OF THE INVENTION

The dielectric resonator stabilized microstrip oscillator of the invention consists of an active oscillator transistor the base of which is connected to a main oscillator line. It also includes an output circuit and a dielectric resonator. The output circuit is coupled to the main oscillator line through the dielectric resonator. The active oscillator transistor is in a common collector configuration and its emitter is terminated to ground through a noise reduction circuit comprised of a ¼ wavelength transmission line and a dc blocking capacitor. The transistor emitter and base are biased through bias coils which pass dc but provide high isolation to RF. Capacitors are connected to ground on the dc side of the coils to provide low impedance to RF and low frequencies thereby minimizing up conversion of transistor baseband noise to RF resulting in low 1/f noise. Back to back varactors in series are located in the main oscillator line ⅛ wavelength from the base of the transistor to maximize the tuning effect of the varactors and minimize the power variations with varactor voltage change. The oscillator main line is terminated in a dc isolated 50 ohm load which prevents transistor oscillation off frequency and eliminates spurious oscillations out of band. The output circuit includes an output line coupled directly to a common emitter buffer amplifier stage. The output circuit also provides a short length of transmission line followed by a series coil to match the output for good output power. A 4 db pad on the output isolates the circuit from load changes.

It is a principal object of the invention to provide a new and improved stable oscillator.

It is another object of the invention to provide a dielectric resonator stabilized microstrip oscillator having improved phase noise with constant frequency and power over temperature.

It is yet another object of the invention to provide an improved L-band dielectric resonator stabilized oscillator that has ultra low phase noise, low 1/f noise corner, constant power and frequency over temperature and a varactor port for phase locking and that can be fabricated of commercially available components.

These together with other objects, features and advantages of the invention will become more readily apparent from the following detailed description when taken in conjunction with the illustrative embodiment in the accompanying drawings.

DETAILED DESCRIPTION OF THE PREFERRED EMBODIMENT

Figure 1:
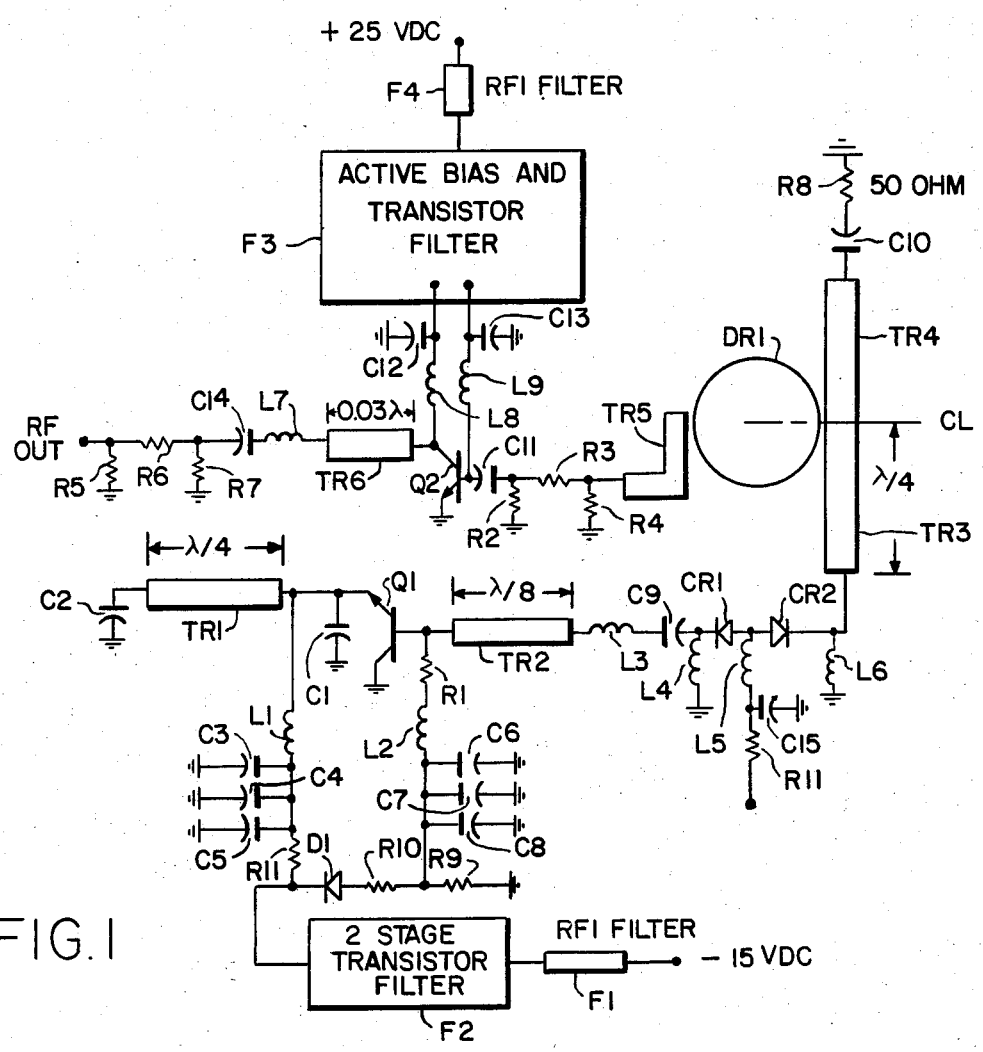
FIG. 1 is a schematic diagram of one presently preferred embodiment of the invention.

The dielectric resonator stabilized microstrip oscillator of the invention is illustrated schematically by FIG. 1. It comprises generally of an oscillator transistor circuit, a main oscillator line, a dielectric resonator DR1, and an output circuit. The oscillator transistor circuit consists of transistor Q1, capacitor C1, a noise reduction circuit of transmission line TR1 and capacitor C2, and a transistor bias circuit. The bias circuit consists of capacitors C3 through C8, inductors L1, L2, resistors R9, R10, R11, diode D1 and filters F1, F2. The main oscillator line consists of transmission line TR2, TR3, TR4, capacitor C9, C10, C15, inductors L3, L4, L5, L6 varactors CR1, CR2 and resistors R8, R11. The output circuit consists of transistor Q2, transmission lines TR5, TR6, resistors R2, R3, R4, capacitors C11, C14, inductor L7, and resistors R5, R6, R7. Bias for transistor Q2 is supplied by the bias circuit of filters F3, F4, inductors L8, L9 and capacitors C12, C13.

Having reference to FIG. 1 with regard to further explanation thereof it is noted that the active oscillator transistor Q1 is in the common collector configuration and capacitor C1 provides the feedback for oscillation. The reflection coefficient at the Q1 base is maximized at the center operating frequency through selection of C1's value. Transmission line TR1 is a quarter wavelength at the center operating frequency and of characteristic impedance 25 ohms. This line connected to the Q1 emitter is terminated to ground but blocked for dc ground by blocking capacitor C2. This noise reduction TR1 line circuit narrows the negative resistance range such that reflection coefficient of the Q1 base is only greater than 1 at the fundamental and less than 1 at all harmonics (2, 3, $4f_o$) as well as subharmonics ($\frac{1}{2}, \frac{2}{3}, \frac{1}{4}f_o$). This circuit gives rise to lower noise due to reduction of harmonic interactions.

The emitter and base are biased with bias coils L1 and L2 (respectively) which pass dc but provide high isolation to RF while capacitors C3 through C8 to ground on the dc side of the coils provide low impedances to RF as well as low frequencies. Providing these low impedances to the transistor at low frequencies minimizes up conversion of transistor baseband noise to RF providing low 1/f noise. The resistor R1 (51 ohm) adds loss to the circuit out of band. Capacitors C3 and C6 (47 pf) provide a low RF impedance to the GHz RF frequency range. C4 and C7 (1500 pf) provide low impedances to frequencies in the MHz range while C5 and C8 (22 uf) provide low impedances to the KHz range of offset frequencies. The bias circuit for the remainder of the circuit is standard.

Back to varactors CR1, CR2 biased in parallel but in series at RF, are located at a low impedance part of the network ($\lambda/8$ from the base of Q1 along TR2 line). In this position, the tuning effect of the varactors is maximized and the power variation with varactor voltage change is minimized. The capacitor C9 voltage variation is a dc blocking capacitor. In this implementation, the discrete inductor L3 series resonates the reactance of the back to back diodes. The diodes are placed back to back to minimize harmonic generation and reduce diode current rectification due to RF voltage which in turn increases noise. The insertion of the diodes in this manner, causes no measurable increase of noise.

The dielectric resonator DR1 appears coupled to the line (TR3) as a parallel resonant circuit at the resonator center line. The transmission line TR3 is a quarter wavelength for stable oscillator operation. Out of band, the resonator does not couple to the main line. The oscillator transistor circuit off frequency sees the fifty ohm dc isolated load (R8) and does not oscillate. This circuit eliminates all spurious oscillations out of band.

The signal is coupled from the main oscillator line through the resonator and lightly coupled to the output transmission line TR5. The output line is coupled directly to a common emitter buffer amplifier stage. A pad (R2, R3, R4) whose value is selected for unconditional amplifier stability (~2 dB) at any frequency precedes the amplifier eliminating spurious oscillations which add to phase noise. The resistor value R2 normally 510 ohm for 2 dB pad is reduced to 82 ohm for lower phase noise due to the effects of non fifty ohm terminal impedance presented by the resonator to the input of the Q2 buffer transistor. The output circuit consists of a short length of transmission line TR6 ($0.03\lambda$) followed by a series coil L7 (7nh) to match the output for good output power. A 4 dB pad (R5, R6, R7) on the output isolates the circuit for load changes.

The DRO of the invention has been fabricated in an aluminum housing having three compartments, namely the oscillator transistor circuit, the dielectric resonator circuit and the buffer amplifier circuit. All three circuits were printed on a common soft microstrip assembly consisting of 0.030 inch thick 5880 Duroid laminated to an aluminum plate; the latter comprising the DRO bottom. Two small coupling holes located in one piece top assembly coupled the 3 circuits. This allowed inspection and adjustment of all circuits independently yet with a common printed circuit.

Figure 2:
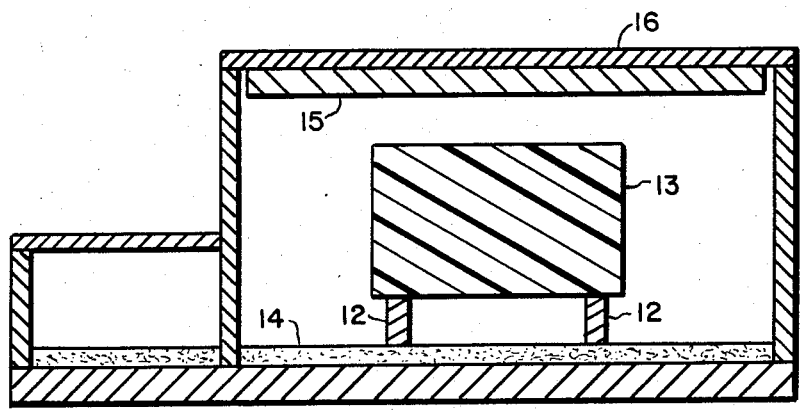
FIG. 2 is a sectional view showing the dielectric resonator of the invention.

FIG. 2 shows the resonator details—a cut away view of the circuit. A quartz ring 12 of proper height is bonded to the resonator puck 13 and to the top of the circuit board 14. The height of quartz ring 12 is adjusted for low noise coupling to the active oscillator transistor. A metal plate 15 of proper thicknesses is screwed to the top plate 16 on the inside to adjust the center frequency to the desired value.

The metal movement of the walls combined with the semiconductor device temperature sensitivities is balanced against the temperature frequency sensitivity of the dielectric material (2.2 ppm./°C.) for a low overall frequency change.

Figure 3:
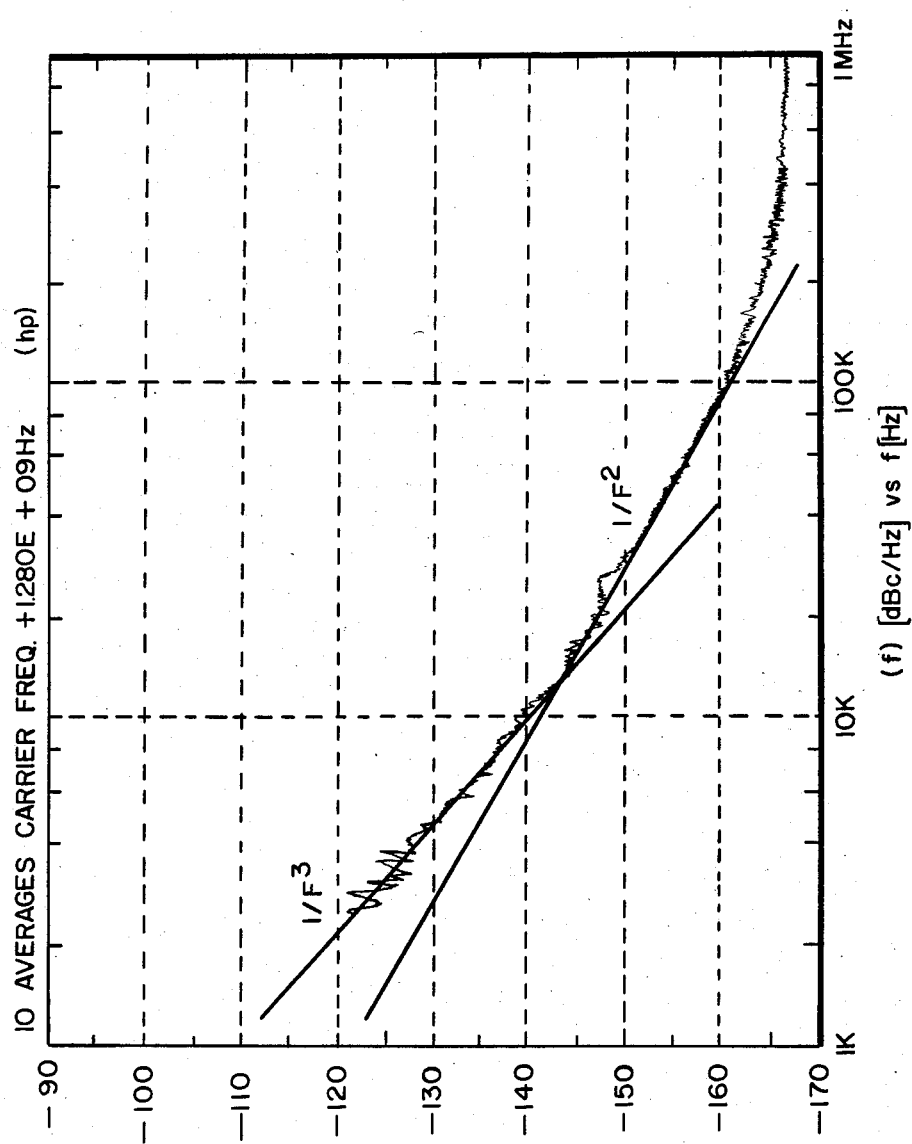
FIG. 3 is a graph depicting the phase noise of two similar DRO oscillators phase locked to each other.
Figure 4:
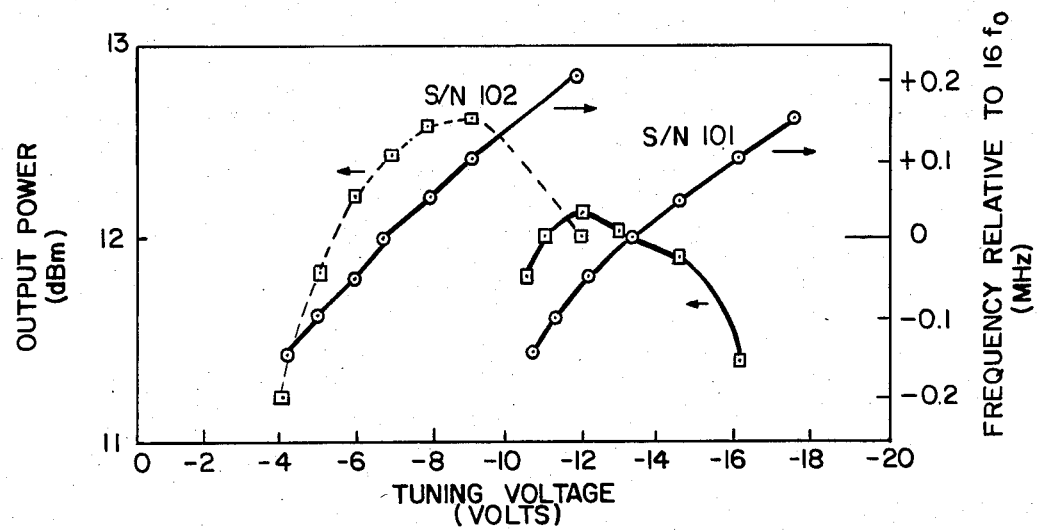
FIG. 4 is a graph illustrating frequency and power versus tuning voltage.
Figure 5:
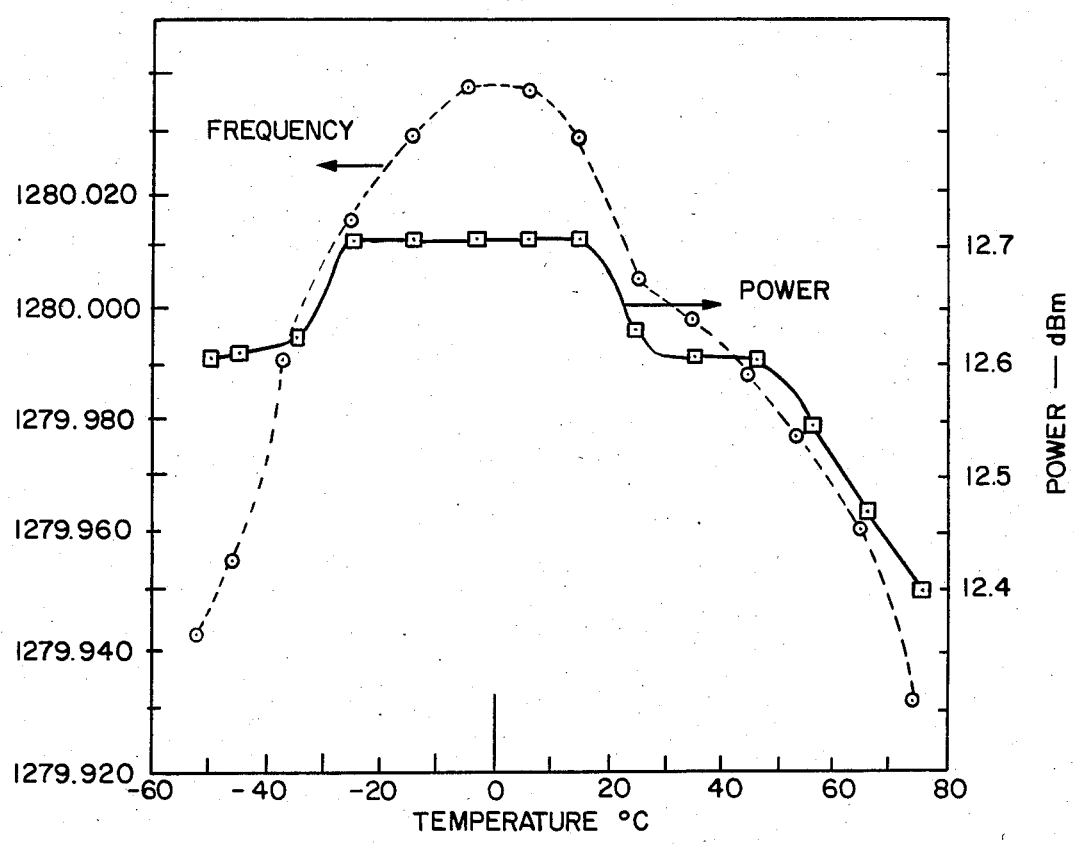
FIG. 5 is a graph illustrating frequency and power versus temperature.

Results of tests performed on the DRO of the invention are illustrated by FIGS. 3, 4 and 5.

FIG. 3 depicts the phase noise of two similar DRO oscillators (S/N 101 and 102) phased locked to each other. The actual noise of each unit is 3 dB better (lower) than the measured data since both oscillators were similar. The phase noise at 100 KHz from the carrier is −163 dBc/Hz and the 1/f noise corner frequency where the phase noise vs frequency changes from $1/f^3$ to $1/f^2$ slope is 12 kHz.

FIG. 4 illustrates the frequency and power vs. tuning voltage. The power changed only 1 dB for a frequency change of 200 KHz. The noise was uneffected by this frequency change.

FIG. 5 shows the frequency and power vs. temperature for S/N 103. The power and frequency changed only 0.3 dB and 100 KHz respectively for a −55 to 75° C. temperature excursion. The varactor tuning range of 200 KHz is more than adequate to maintain constant frequency. The sensitivity of frequency and power to oscillating transistor voltage is measured 5.7 KHz/volt with a peak to peak frequency change of 8.5 KHz for a 1.5:1 VSWR through all phases.

It is apparent from the foregoing that the stated objects of the invention have been accomplished and that a novel microstrip L-band DRO has been realized which provides ultra low phase noise, low 1/f noise corner, constant power and frequency over temperature with a varactor port for phase locking and slight corrections. All of these desired parameters have been achieved simultaneously by means of the new and novel L-band microstrip DRO described herein. Furthermore, the device can readily be fabricated using only commercially available components.

While the invention has been described in one presently preferred embodiment, it is understood that the words which have been used are words of description rather than words of limitation and that changes within the purview of the appended claims may be made without departing from the scope and spirit of the invention in its broader aspect.

What is claimed is:

1. A dielectric resonator stabilized microstrip oscillator comprising:

an oscillator transistor having a base, a collector and an emitter and bias means, including bias feeds to said oscillator transistor emitter and base through bias inductors for high isolation to RF and including capacitance means connected between said bias feeds and ground to effect low impedance at selected RF and low frequency ranges, a noise reduction circuit comprised of a transmission line and a capacitor connected in series between said oscillator transistor emitter and ground said transmission line being ¼ wavelength long at operating frequency and having a characteristic impedance of 25 ohms, a load, a main oscillator line connecting said oscillator transistor base to said load, a dielectric resonator, and an output circuit, said output circuit being coupled to said main oscillator line through said dielectric resonator.

2. A dielectric resonator stabilized microstrip oscillator as defined in claim 1 wherein said main oscillator line includes first and second varactors and an inductor, said varactors being connected in a back to back series configuration in series with said inductor and being positioned approximately ⅛ wavelength from the base of said oscillator transistor.

3. A dielectric resonator stabilized microstrip oscillator as defined in claim 1 wherein said output circuit comprises:

an output buffer amplifier having a base, a collector and an emitter and bias means, a first resistance means having a resistance value selected for buffer amplifier stability, the base of said buffer amplifier being coupled to said dielectric resonator through said first resistance means, a second resistance means providing an output terminal, a capacitor, and, an inductor, said capacitor and said inductor being connected in series between the emitter of said output buffer amplifier and said second resistance means.

4. A dielectric resonator stabilized microstrip oscillator comprising:

an active oscillator transistor having a base, a collector and an emitter and bias means and being in a common collector configuration, said bias means including bias feeds to said oscillator transistor emitter and base through bias inductors for high isolation to RF and including capacitance means connected between said bias feeds and ground to effect low impedance at selected RF and low frequency ranges, a noise reduction circuit comprised of a transmission line and a capacitor connected in series between said oscillator transistor emitter and ground, said transmission line being ¼ wavelength long at center operating frequency and having a characteristic impedance of 25 ohms, a 50 ohm load a main oscillator line connecting said oscillator transistor base to said 50 ohm load, said main oscillator line including first and second varactors and an inductor, said varactors being connected in a back to back series configuration in series with said inductor and being positioned approximately ⅛ wavelength from the base of said oscillator transistor, a dielectric resonator, and, an output circuit, said output circuit being coupled to said main oscillator line through said dielectric resonator, said output circuit comprising, an output buffer amplifier having a base, a collector and an emitter and bias means, a first resistance means having a resistance value selected for buffer amplifier stability the base of said buffer amplifier being coupled to said dielectric resonator through said first resistance means, a second resistance means providing an output terminal, a capacitor, and, an inductor, said capacitor and said inductor being connected in series between the emitter of said output buffer amplifier and said second resistance means.

* * * * *